(12) United States Patent
Joffe (10) Patent No.: US 6,937,095 B2
(45) Date of Patent: Aug. 30, 2005

(54) EFFICIENT, SWITCHED LINEAR SIGNAL DRIVER

(75) Inventor: Daniel M. Joffe, Owens Crossroads, AL (US)

(73) Assignee: ADTRAN, Inc., Huntsville, AL (US)

( * ) Notice: Subject to any disclaimer, the term of this patent is extended or adjusted under 35 U.S.C. 154(b) by 0 days.

(21) Appl. No.: 10/368,815

(22) Filed: Feb. 19, 2003

(65) Prior Publication Data

US 2004/0164800 A1 Aug. 26, 2004

(51) Int. Cl.[7] .............................................. H03F 3/217
(52) U.S. Cl. .................................... 330/251; 330/207 A
(58) Field of Search ............................ 330/251, 207 A, 330/207 P, 298; 381/55, 120

(56) References Cited

U.S. PATENT DOCUMENTS

| | | | | |
|---|---|---|---|---|
| 3,636,380 A | * | 1/1972 | Anderson | .................. 327/205 |
| 5,438,694 A | * | 8/1995 | Muri et al. | .................. 455/341 |
| 5,847,610 A | * | 12/1998 | Fujita | .......................... 330/298 |

* cited by examiner

Primary Examiner—Henry Choe
(74) Attorney, Agent, or Firm—Thomas, Kayden, Horstemeyer, & Risley, L.L.P.

(57) ABSTRACT

The invention provides a switched linear amplifier for amplifying an input signal for provision to a communication medium. The switched linear amplifier includes a linear amplifier, an output current detector, and a switched inductive circuit. The linear amplifier amplifies the input signal to produce a linearly amplified signal. The output current detector is operative to detect an output current level having a magnitude greater than a predetermined threshold and provide a control signal. The switched inductive circuit is responsive to the control signal from the output current detector to provide an output current via a switched (and ideally lossless) inductive path, to provide a highly efficient means of generating a linearly amplified signal for provision to the communication medium.

20 Claims, 7 Drawing Sheets

EFFICIENT, SWITCHED LINEAR SIGNAL DRIVER

FIELD OF THE INVENTION

The present invention relates, in general, to communication systems and signal driver circuits. More particularly, the present invention relates to a switched linear signal driver for providing a desired communication signal on a communication line or medium.

BACKGROUND OF THE INVENTION

Signal driver circuits ("drivers") are utilized in transceivers (or transmitters) to place or provide a desired signal, such as an analog or digital communication signal, on a communication line or other communication medium, such as the cables of twisted pairs utilized in digital subscriber line ("DSL") systems. In general, it is highly desirable for such drivers to provide a high degree of linearity, such that the signal placed on the communication line is an amplified replica of the desired signal, without the introduction of various distortions, such as non-linearities and noise.

Prior art linear signal driver circuits, however, are generally very inefficient, largely due to a high ratio of peak-to-rms (root-mean-square) signal voltages, such that only a small percentage of input power is coupled to the signal placed on the communication line. The efficiency of a prior art linear driver is inversely proportional to the ratio of peak-to-rms signal voltages, with efficiencies generally in the range of twenty percent or less.

Figure 1:
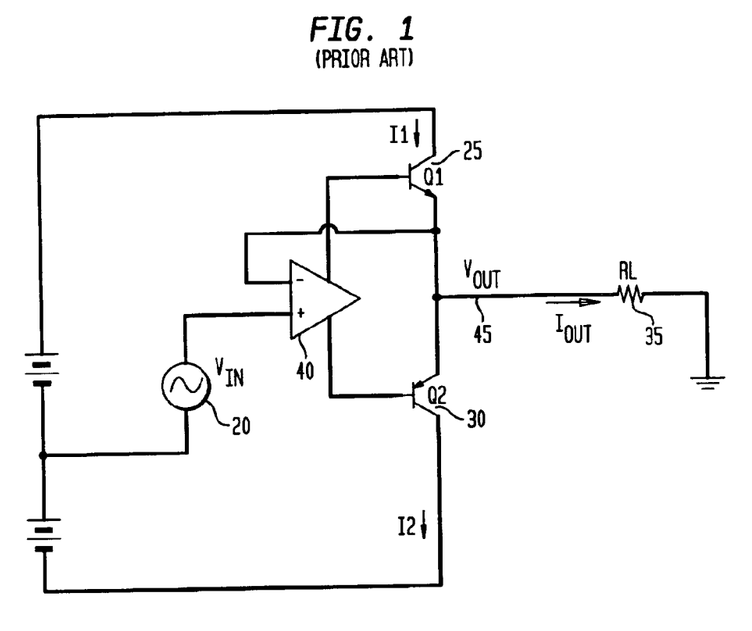
FIG. 1 is a circuit diagram illustrating a prior art linear driver output stage.

FIG. 1 is a circuit diagram illustrating a prior art linear driver 10. As illustrated, Vin 20 is the desired signal, represented as an input voltage, to be provided in amplified form as an output voltage (or output signal), Vout 45, on a communication line, which is represented as a resistive load "RL" 35. DC power supply and bias voltages are provided for the circuit by one or more power supplies, represented as Vcc 15 or as Vs in the various diagrams, with the driving or amplification performed by operational amplifier 40, and transistors Q1 25 and Q2 30.

In such a prior art linear driver 10, because of the low efficiencies, a large percentage of the input power to the signal drivers is dissipated as heat, imposing cooling requirements within the transceiver. Since most of the power to a transceiver is used by the signal drivers, the corresponding efficiency of such a transceiver is undesirably low, which imposes increased power supply requirements for the transceiver.

Using the relationship between the DC current (average current "Idc") and the RMS current ("Irms") for a system where the signal has a truncated Gaussian probability distribution function ("PDF") with a peak-to-rms ratio ("pk2rms") of 3 or greater (about 1% accuracy at 3 to 1 pk2rms), then $$Idc = \sqrt{\frac{2}{\pi}} \cdot Irms.$$

The total power dissipated in such a system is Idc*Vdc, where Vdc is the total supply voltage of the system (e.g., if the drivers run from +/−10 Volts, then Vdc=20).

For such a prior art linear driver circuit 10 as illustrated in FIG. 1, assuming Vout has a truncated Gaussian PDF and peak-to-rms ratio of 3 or greater, and that RL is composed of two parts, a source resistance Rs and a termination resistance Rt, it may be shown that the theoretical maximum efficiency of the linear driver is:

$$Theoretical\_Maximum\_Efficiency = \sqrt{\frac{\pi}{2}} \cdot \frac{1}{pk2rms \cdot \left(1 + \frac{Rs}{Rt}\right)}.$$

For the case of the DSL standard referred to as HDSL-2 CO (with CO referring to a Central Office), in which Rs=Rt and pk2rms=4.0, the theoretical maximum efficiency is 15.7%. Actual efficiencies however, including overhead voltages and currents in the driver, will be significantly less, with the best case for a real HDSL-2 CO driver having an efficiency of approximately 8.6%. In such a prior art HDSL-2 CO driver, approximately 90% of the power supply energy is dissipated as heat.

As a consequence, a need remains for a signal driver circuit, which has significantly improved power efficiency, while retaining significant linearity and accuracy. Such a signal driver circuit should also be readily implementable, should be backwards compatible for use in existing technologies, and should be capable of embodiment without undue expense.

BRIEF DESCRIPTION OF THE DRAWINGS

The foregoing and other objects, features and advantages of the present invention will be more readily appreciated upon reference to the following disclosure when considered in conjunction with the accompanying drawings, in which:

FIG. 5, divided into FIGS. 5A, 5B and 5C, is a block and circuit diagram illustrating in detail the third apparatus embodiment of an efficient, switched linear driver in accordance with the present invention.

DETAILED DESCRIPTION OF THE EXEMPLARY EMBODIMENTS

While the present invention is susceptible of embodiment in many different forms, there are shown in the drawings and will be described herein in detail specific, exemplary embodiments thereof, with the understanding that the present disclosure is to be considered as an exemplification of the principles of the invention and is not intended to limit the invention to the specific embodiments illustrated.

As mentioned above, a need remains for a signal driver circuit, which has significantly improved power efficiency, while retaining significant linearity and accuracy. Such a signal driver circuit is provided in accordance with the present invention. The present invention utilizes both linear amplification and switching amplification, providing both a high degree of linearity while providing improved power efficiencies. The linear driver portion of the invention provides control over the linearity or accuracy of the output signal. The switching driver portion, utilizing a switched inductive circuit, provides the bulk of the output current at a very high efficiency, as needed. The present invention is also readily implementable and backwards compatible for existing technologies, and capable of embodiment without undue expense.

Figure 2:
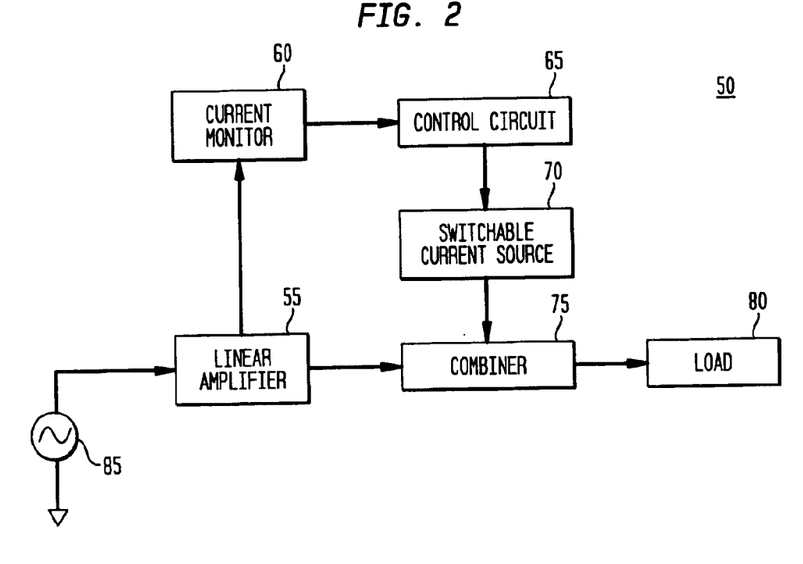
FIG. 2 is a block diagram illustrating, a first apparatus embodiment of an efficient, switched linear driver in accordance with the present invention.

FIG. 2 is a block diagram illustrating, in general, a first apparatus embodiment 50 of an efficient, switched linear driver in accordance with the present invention. The switched linear driver 50 provides a signal to a load 80, and the switched linear driver 50 includes a linear amplifier 55, a current monitor 60, control circuit 65, a switchable (or second) current source 70, and a combiner (or summer) 75. In accordance with the invention, the linear amplifier 55 amplifies the input signal 85 and controls the voltage level of any signal applied to the load 80, independently of any output current supplied to the load 80, thereby minimizing any introduced distortions. The output current to the load 80 may be provided through the linear amplifier 55, for comparatively low current levels, or, as discussed below, through a combination of the linear amplifier 55 and the switchable current source 70, for comparatively high output current levels. In this latter case, the switchable current source 70, as a second current source, provides the bulk of the output current, minimizing the amount of current provided from the linear amplifier 55, and thereby significantly increasing the efficiency of the switched linear driver 50.

In accordance with the invention, the current in the linear amplifier 55 delivered to the load 80 is monitored by current monitor 60, with resulting current level information provided to the control circuit 65. When the magnitude of linear amplifier 55 current level is greater than a predetermined threshold, the control circuit 65 provides a first switching signal to the switchable current source 70 to switch to an "on" state and provide current (through combiner 75) to the load 80. When the magnitude of linear amplifier 55 current level is less than the predetermined threshold, the control circuit 65 provides a second switching signal to the switchable current source 70 to remain in or switch to an "off" state, such that the current to the load 80 is provided through the linear amplifier 55. This current monitoring operation of current monitor 60 is similar for both positive and negative current levels, with measurement of the magnitude of the current level providing for both polarities.

It should be noted that the functionality of the control circuit 65 may be combined with the functionality of the current monitor 60, which may then monitor current levels of the linear amplifier 55 and, when above or below the predetermined threshold, provide the switching signal information directly to the switchable current source 70.

This first embodiment for a switched linear amplifier 50 for amplifying an input signal may be viewed as comprising, first, a linear amplifier 55 for amplifying the input signal to produce a linearly amplified signal; second, a current monitor 60 capable of detecting a current level of the linear amplifier and (when combined with control circuit 65) providing a control signal when a magnitude of the current level is greater than a predetermined threshold; and third, a switchable current source 70 capable of responding to the control signal to provide current with the linearly amplified signal.

In another variation, the switched linear amplifier 50 may be more generally viewed as comprising, first, a linear amplifier 55 for amplifying the input signal to produce a linearly amplified signal; and second, a switchable current source 70 capable of providing current with the linearly amplified signal when a magnitude of a current level of the linear amplifier is greater than a predetermined threshold. In this latter variation, current detection and switching control may be within or distributed between either or both the linear amplifier 55 and/or the switchable current source 70.

It should be noted that the linear amplifier 55, the current monitor 60, the control circuit 65, the switchable current source 70, and the combiner 75, may be implemented equivalently in a wide variety of ways by those of skill in the art. As illustrated below, for example, the current monitor 60 or current detector 240 is implemented using voltage dividers having discrete components, such as a plurality of resistors. In other embodiments, particularly integrated circuit embodiment, the current monitor 60 or current detector 240 may be implemented using, for example, a current mirror or a current sensing transformer. Similarly, and also for example and not limitation, any of the various switches may be implemented equivalently in a wide variety of ways by those of skill in the art, such as through one or more transistors of any applicable type or kind. Any and all such variations are considered to be within the scope of the present invention.

Figure 3:
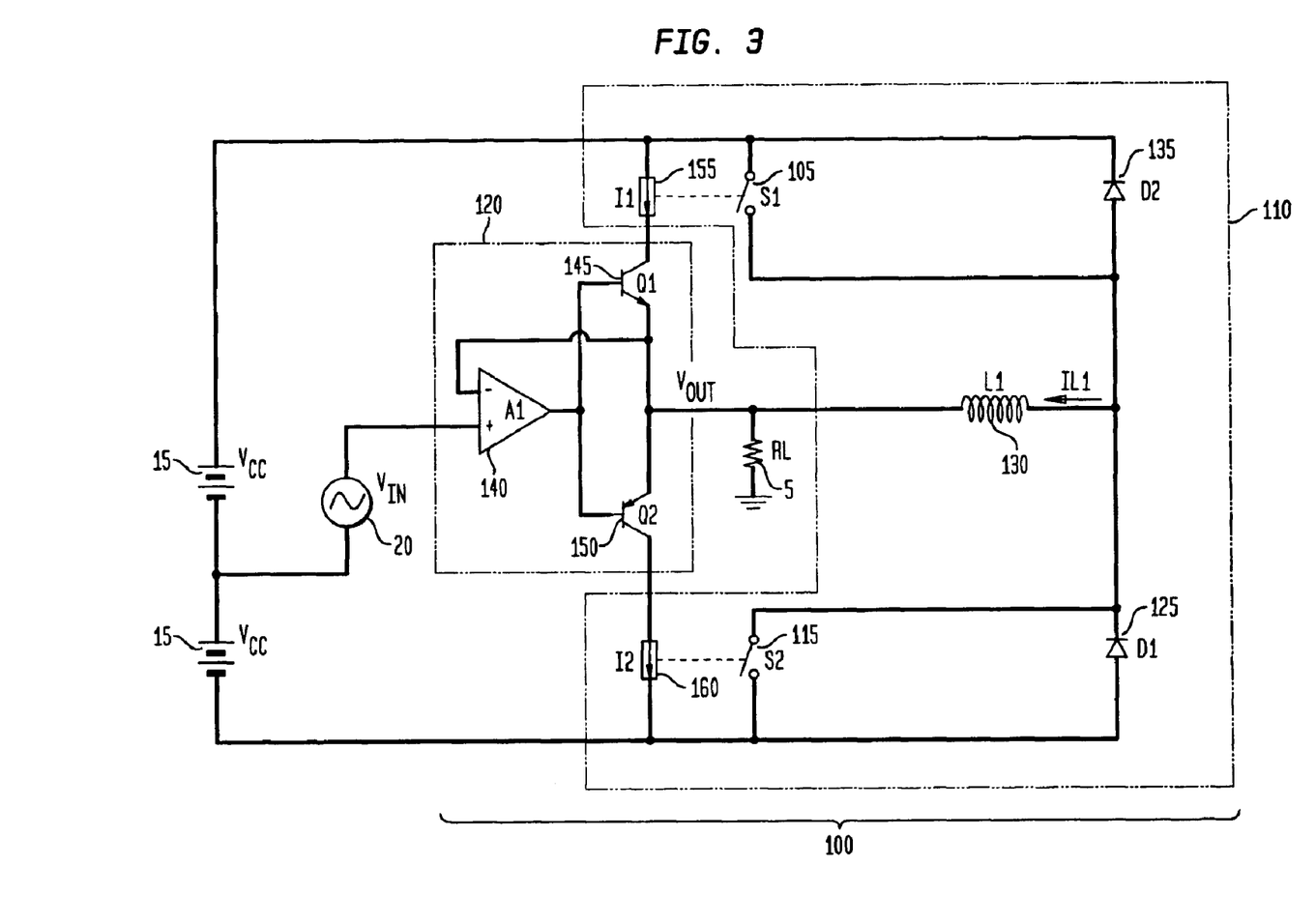
FIG. 3 is a circuit and block diagram illustrating a second apparatus embodiment of an efficient, switched linear driver in accordance with the present invention.

FIG. 3 is a circuit and block diagram illustrating a second apparatus embodiment of an efficient, switched linear driver 100 in accordance with the present invention. The signal driver circuit 100 provides a linear amplifier 120 in parallel with an inductive switching driver 110 to provide current to a load RL (5). In this second embodiment 100, the inductive switching driver 110 is comprised of switches S1 (105) and S2 (115), diodes D1 (125) and D2 (135), current detectors I1 (155) and I2 (160), and inductor L1 (130). Optionally, a filter may also be included before providing current to the load RL. The linear amplifier 120 (or, equivalently, a non-switching driver) is comprised of operational amplifier (op amp) A1 (140), and transistors Q1 (145) and Q2 (150). While illustrated using bipolar junction transistors, it should be noted that any type of gain element may be used, including CMOS or bipolar transistors. Switches S1 and S2 preferably are current controlled switches, under the control, respectively, of current detectors I1 (155) and I2 (160). There are at least two methods for control of S1 and S2, and numerous other equivalent methodologies will be apparent to those of skill in the art.

In the first and preferred method of controlling S1 and S2, referred to as sigma-delta control, S1 (or S2) is turned on whenever I1 (or I2) exceeds a minimum (or predetermined threshold) current level (Imin) and the next high speed clock edge occurs. At that time, the inductor 130 current IL1 starts to build up, supplying current to the load RL (5), and diminishing the amount of current that Q1 (or Q2) must supply. If, at the end of that high speed clock cycle, the current through L1 (IL1) has increased enough so that the current through Q1 (or Q2) has dropped below Imin, then S1 (or S2) will turn off for the next high speed clock cycle. If however, I1 is greater than Imin, then S1 (or S2) will remain on, and the inductor current IL1 will continue to build, supplying more of the load current for RL 5.

S1 (or S2) is used in an on-off manner to keep I1 (or I2) less than or equal to Imin. The linear driver 120 also absorbs any error current, maintaining linear amplification. The switching driver 110 supplies the bulk of the output current, making the linear driver more efficient while maintaining the requisite linearity.

In the second method of controlling S1 and S2, referred to as hysteretic control, S1 (or S2) turns on whenever I1 (or I2) exceeds a maximum current level ($I_{HIGH}$), and turns off whenever I1 (or I2) is less than a minimum current level ($I_{LOW}$). With this second method, no high-speed clock is needed. However, the minimum on-times and off times potentially may become so short as to be problematic or otherwise undesirable.

In both control methods, the switches S1 and S2 are turned off when I1 and I2 drop below some minimum current level. As long as this minimum is greater than the quiescent current in the linear part of the driver 120, S1 and S2 will never be on at the same time, providing that there will be no simultaneous conduction problems with S1 and S2.

Diodes D1 (125) and D2 (135) provide a path for the inductor current when the inductor current IL1 is non-zero and both switches are off, preventing the formation of destructive voltages, and returning energy stored in L1 (130) to Vcc 15.

Additional control methods may also be used, such as a higher-order sigma-delta, to suppress low frequency noise. In addition, while illustrated in FIG. 3 with one inductor and two switches, 2 or more inductors with 2 or more pairs of switches may also be utilized equivalently, to provide desired current levels with a lower switching frequency.

As may be apparent, with the switched linear driver 100 of FIG. 3, the linear driver 120 power is dramatically reduced because the majority of the needed driving power is delivered through the inductor L1 (130). The linear driver 120 works over a comparatively smaller range of operating currents, improving linearity. The inductive switching driver 110 delivers power to the load without dissipation losses, and efficiency is greatly increased. While complexity of the switched linear driver 100 is greater than prior art linear drivers, the switched linear driver 100 is amenable to integration.

The value of L1 130 and the switching frequency may be determined in a variety of ways. The following discussion provides various methods, as examples.

For the sigma-delta control method, assuming that the control loop clock has period T, the input signal is band-limited to frequency fmax, the maximum output amplitude is Amax, the load is largely resistive and the lowest load resistance is RLMIN, then the highest slew-rate signal that can be processed has a slew rate of Amax*2*pi*fmax, then the most that the output current can change in one clock period is:

Max_Delta_1=Amax*2*pi*fmax*T/RLMIN.

For a sine wave, the maximum dV/dt occurs around 0, so using an incremental form of the inductor equation to find an inductor value of Lmax, where Lmax is the maximum value of inductance that lets the inductor supply all the current at the highest frequency of operation in worst case conditions:

$$\frac{1}{L\max} \cdot T \cdot Vcc = \frac{2\pi \cdot A\max \cdot f\max}{RL\text{MIN}} \cdot T$$

$$L\max = Vcc \frac{RL\text{MIN}}{(2\pi \cdot A\max \cdot f\max)}$$

A particular advantage, Lmax is independent of the clock period T. Using this value of Lmax to determine how much the inductor current (IL1) might grow in an interval T, then $$\text{delta\_I} = 2\pi \cdot A\max \cdot \frac{f\max}{RL\text{MIN}} \cdot T,$$

where delta_1 is the current that the linear driver must handle above a threshold value, which should be kept small to keep linearity high. Solving for T, the sampling rate of the overall system, based on the maximum desired current level through the amplifier A1, is then:

$$T\max = \text{delta\_I} \cdot \frac{RL\text{MIN}}{(2\pi \cdot A\max \cdot f\max)}$$

As an example, using an AD8042 op-amp (from Analog Devices, Inc.) with a current of 50 mA as delta_1, operated with plus and minus 5 Volt power rails, and delivering Amax equal to 4 Volts and 200 mA peaks to a load, then RLMIN=4/0.2=20 Ohms. Assuming that the maximum frequency is 400 kHz (e.g., for HDSL-2), and that Amax is 4, then Tmax is:

$$0.05 \frac{20}{2\pi \cdot 4 \cdot 400000} = 9.947 \times 10^{-8}$$

which provides a switching frequency of about 10 MHz.

As a second example in the audio band, also using the AD8042 for A1, aided by the switched inductor system 110 to drive an 8 ohm loudspeaker, with Amax of 4 and fmax is 20000, results in:

$$T\max = \left(0.05 \frac{8}{2\pi \cdot 4 \cdot 20000}\right) = 7.958 \times 10^{-7},$$

for a frequency of about 1.25 MHz. The inductor value is $$\frac{5 \cdot 8}{2\pi \cdot 20000 \cdot 4} = 7.958 \times 10^{-5}.$$

If the switching frequency is changed to 1 MHz then the inductor value is 100 micro-Henries.

Figure 4:
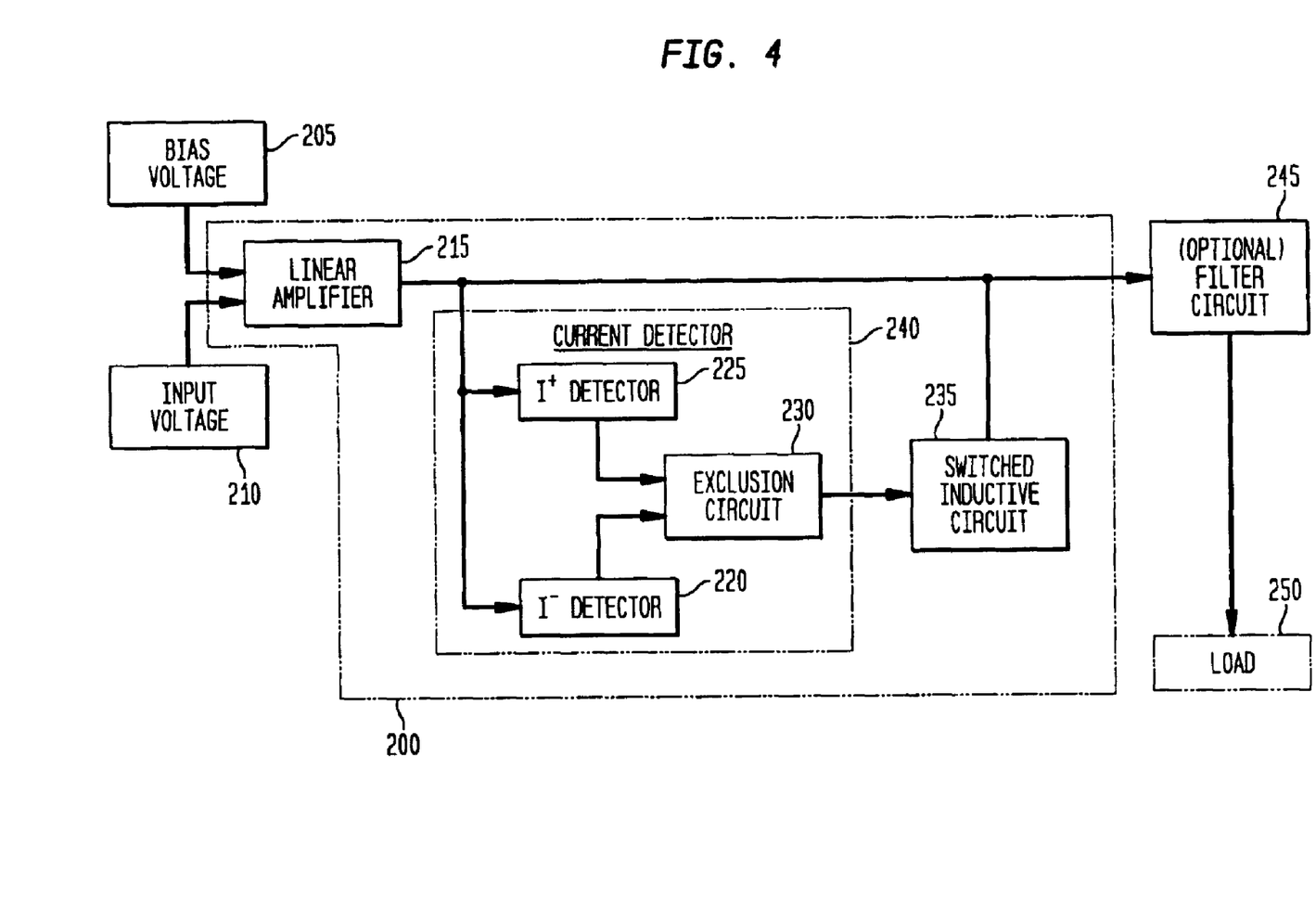
FIG. 4 is a block diagram illustrating, in general, a third apparatus embodiment of an efficient, switched linear driver in accordance with the present invention.

FIG. 4 is a block diagram illustrating, in general, a third apparatus embodiment of an efficient, switched linear driver 200 in accordance with the present invention. As illustrated in FIG. 4, the switched linear driver 200 includes a linear amplifier 5, a current detector 240 (further comprised of a first current ($I^+$) detector 225, a second current ($I^-$) detector 220, and an exclusion circuit 230), and a switched inductive circuit 235. A bias voltage 205 is provided. The switched linear driver 200 provides an amplified version of an input signal (illustrated as input voltage 210) to a load 250. The amplified version of the input signal optionally may also be coupled to the load 250 through an optional filter circuit 245, as illustrated. While the preferred embodiments of each of these components are illustrated in detail in FIG. 5, the various functions of them may be explained.

The linear amplifier 215 provides an amplified version of an input signal (input voltage 210). The positive current detector 225, the negative current detector 220, and the exclusion detector 230, collectively comprise the current detector 240. To efficiently provide a higher level of output current to the load 250, first current ($I^+$) detector 225 and second current ($I^-$) detector 220 are utilized to sense increased output current levels (with corresponding positive and negative polarities or directions), above or beyond corresponding positive and negative predetermined thresholds (i.e., the positive sensed output current being greater than a positive threshold, and/or the negative sensed output current being more negative than a negative threshold). The outputs from the first current (I⁺) detector 225 and second current (I⁻) detector 220 are provided to an exclusion circuit 230, which prevents different portions (switches) of the switched inductive circuit 235 (S1 (236) and S2 (237)) from being on simultaneously (in the event that both first and second current detectors 225 and 220 simultaneously indicate that the sensed current is greater than the predetermined threshold). When sensed output current is greater than the predetermined thresholds (i.e., either more positive or more negative than the corresponding thresholds), a corresponding control signal from the exclusion circuit 230 is provided to the switched inductive circuit 235. This switching on allows one of the switches (S1 or S2) to be in a conductive state in the switched inductive circuit 235 and provides an inductive path for providing increased current to the load 250, thereby allowing the bulk of current to the load 250 to be supplied through an inductor (238) of the inductive switching driver 110.

In summary, the second switched linear amplifier of the present invention consists of, first, a linear amplifier for amplifying the input signal to produce a linearly amplified signal; second, an output current detector coupled to the linear amplifier, the output current detector operative to detect an output current level greater than a predetermined threshold and provide a control signal; and third, a switched inductive circuit coupled to the linear amplifier and to the output current detector, wherein the switched inductive circuit is responsive to the control signal to provide an inductive path for generating or creating an increased output current level with the linearly amplified signal to the communication medium, such as a DSL twisted pair or DSL cable.

Figures 5, 5A:
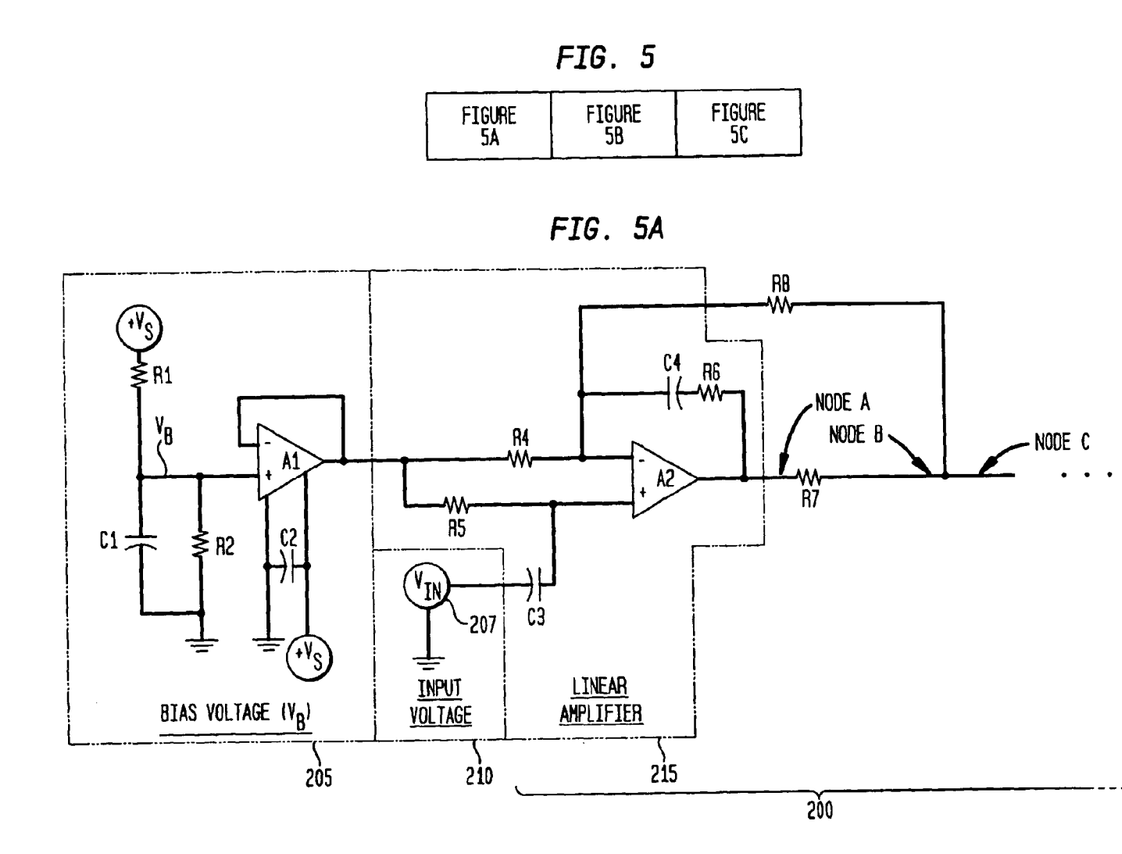

FIG. 5, divided into FIGS. 5A, 5B and 5C, is a circuit and block diagram illustrating in detail the third, preferred apparatus embodiment of an efficient, switched linear driver 200 in accordance with the present invention. As discussed above, bias voltage circuit 205 provides a bias voltage for use in the linear amplifier 215, while the input voltage (Vin 207), as the input signal, is provided to the linear amplifier 215 through the input voltage circuit 210. The input signal is amplified by linear amplifier 215, producing a linearly amplified signal at node A, as illustrated in FIG. 5A.

Figure 5B:
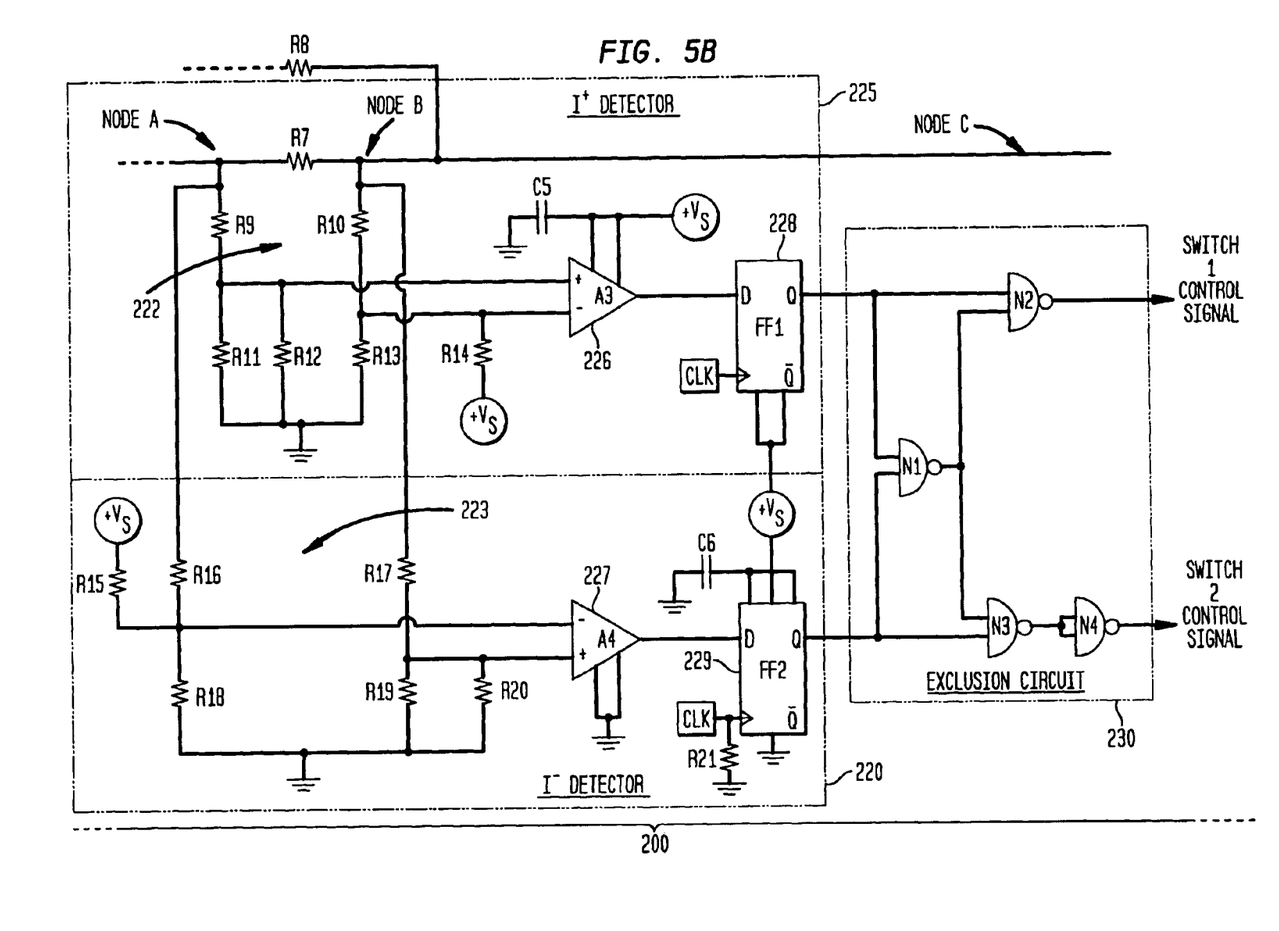

Referring to FIG. 5B, output current (through resistor R7) is sensed using the first current (I⁺) detector 225 and the second current (f) detector 220, to determine whether this sensed current is greater than a predetermined or pre-set threshold or range, i.e., given an AC input signal for amplification, whether the positive sensed current is greater than a predetermined positive threshold, and/or the negative sensed current is greater (more negative) than a predetermined negative threshold. (It should be understood that the use of the terms positive and negative, as applied to currents and/or voltages, should be understood to respectively refer to direction and polarity, as known and understood in the electronics fields.) If the sensed output current is beyond such a positive and negative range, current will be supplied more efficiently through the switched inductive circuit 235, as discussed below. Positive current (through resistor R7) is sensed using the first current (I⁺) detector 225, and negative current (through resistor R7) is sensed using the second current (I⁻) detector 220, using respective voltage divider circuits 222 and 223. The sensed current from each voltage divider 222 and 223 is then compared to corresponding, predetermined positive and negative threshold levels in respective comparators A3 (226) and A4 (227). The resulting values from comparators A3 (226) and A4 (227), indicating whether or not the sensed current is greater than the predetermined threshold, are stored for one clock cycle in the respective D flip-flops FF1 (228) and FF2 (229). This use of the flip-flops FF1 and FF2 assures that the switched inductive circuit 235 is in a switching mode, and further helps with the predictability of the noise spectrum. A hysteretic mode may also be implemented, as discussed above. Also as mentioned above, the current detectors (first current (I⁺) detector 225 and second current (I⁻) detector 220) also may be implemented equivalently in a wide variety of ways within the scope of the present invention (and, for example, with R7 being extraneous in various embodiments and utilized herein as a selected, general way of illustrating output current sensing).

To avoid both switches S1 (236) and S2 (237) being on simultaneously in the switched inductive circuit 235, an exclusion circuit 230 is utilized in the third embodiment, "locking out" both of the two switch control signals in the event that both first current (I⁺) detector 225 and second current (I⁻) detector 220 simultaneously indicate that the sensed current is greater than the predetermined threshold. The exclusion circuit provides two output signals, a switch 1 control signal (p signal) and a switch 2 control signal (n signal), to the switched inductive circuit 235, as illustrated.

Figure 5C:
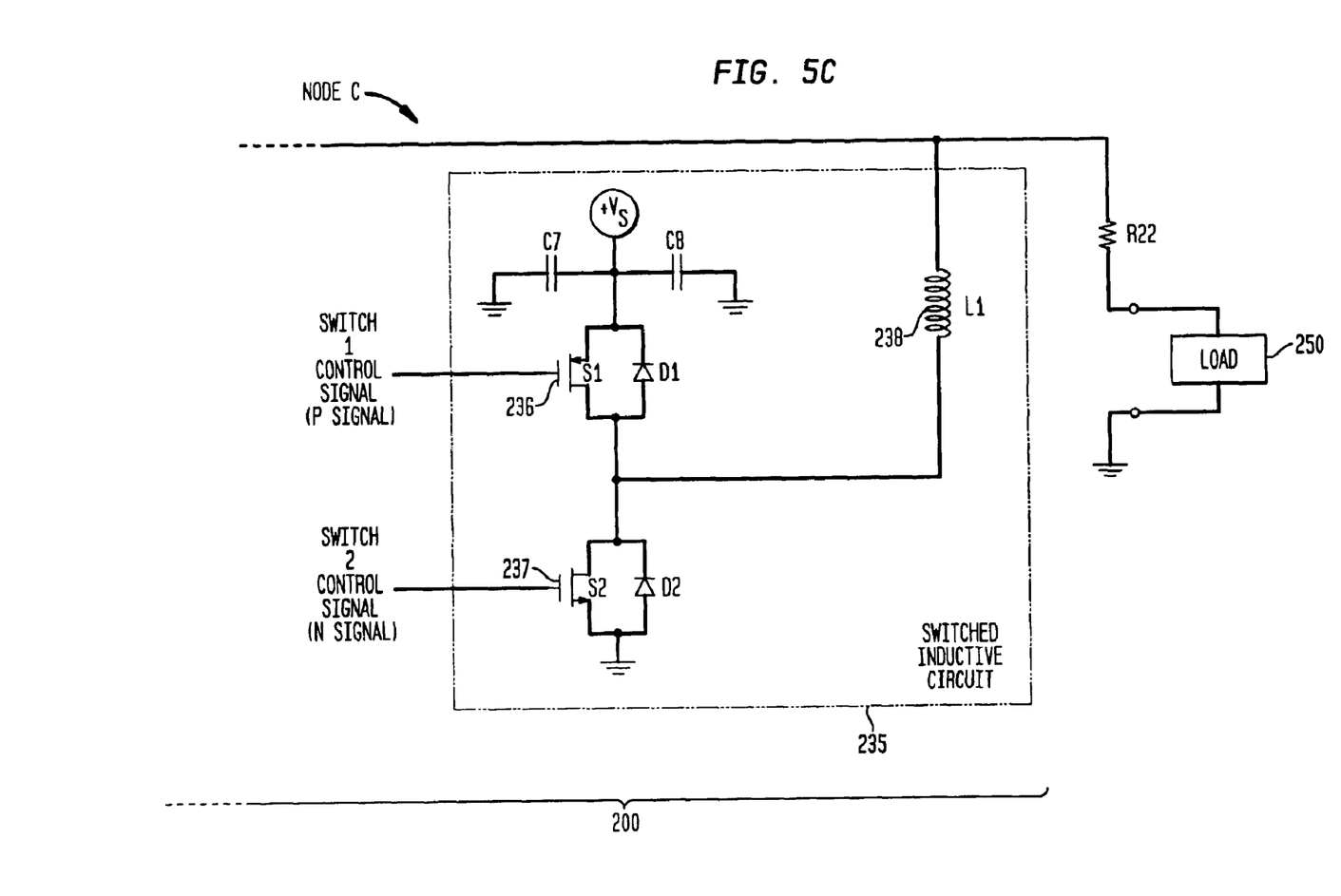

Referring to FIG. 5C, when the sensed current is more positive or more negative than the respective predetermined thresholds, as determined by either the first current (I⁺) detector 225 or the second current (F) detector 220, one of the switches S1 or S2, respectively, will be in a conductive state (i.e., will be on), allowing current flow through the inductor L1 (238). When this switching occurs, an additional, separate inductive path is provided, thereby providing the bulk of the output current with the linearly amplified signal to a load 250. As mentioned above, the switches S1 and S2 may be implemented equivalently in a wide variety of ways within the scope of the present invention, in addition to the illustrated FET implementation.

In this third embodiment, the components of FIG. 5 have the following values (k=kilo):

For bias voltage circuit 205:

| R1: 10k Ohms | C1: 0.1 µF |
|---|---|
| R2: 10k Ohms | C2: 0.1 µF |

For input voltage circuit 210 and linear amplifier circuit 215:

| R4: 1k Ohms | R5: 1k Ohms |
|---|---|
| R6: 1k Ohms | C3: 10 µF |
| C4: 10 pF | |

For first current (I⁺) detector 225:

| R9: 1k Ohms | R10: 1k Ohms |
|---|---|
| R11: 4k Ohms | R12: 100k Ohms |
| R13: 4k Ohms | R14: 100k Ohms |
| C5: 0.1 µF | R7: 10 Ohms |

For second current (I⁻) detector 220:

| | |
|---|---|
| R15: 100k Ohms | R16: 1k Ohms |
| R17: 1k Ohms | R18: 4k Ohms |
| R19: 4k Ohms | R20: 100k Ohms |
| C6: 0.1 μF | R21: 49.9 Ohms |

For switched inductive circuit 235:

| | |
|---|---|
| C7: 0.1 μF | C8: 10 μF |
| L1: 100 μH | |

Other component values in the switched linear driver circuit 200 include 4k Ohms for R8, 10 Ohms for R22, with a supply voltage (Vs) of +5 V. It should be noted that depending upon the supply voltage and other conditions, the values of these components above may vary from those illustrated. In the third embodiment, operational amplifiers A1 and A2 are implemented using AD8042 circuits (ICs), comparators A3 and A4 are implemented using CMP402 circuits (ICs), D flip-flops FF1 and FF2 are implemented using 74HC74 circuits (ICs), with the switches S1 and S2 and diodes D1 and D2 implemented using an IRF7105 circuit (IC). The switches S1 and S2, and Schottky diodes D1 and D2, also may be implemented using known circuits, with none herein considered more preferable than others.

The methodology of the invention provides a useful summary of the present invention. First, the invention linearly amplifies an input signal to produce an amplified signal, for supply to a load, preferably using a linear amplifier. Next, the invention senses or detects a current level. When the sensed current level is greater than a predetermined threshold, the invention provides an increased level of current (to the load) through a switched inductive path.

Figure 6:
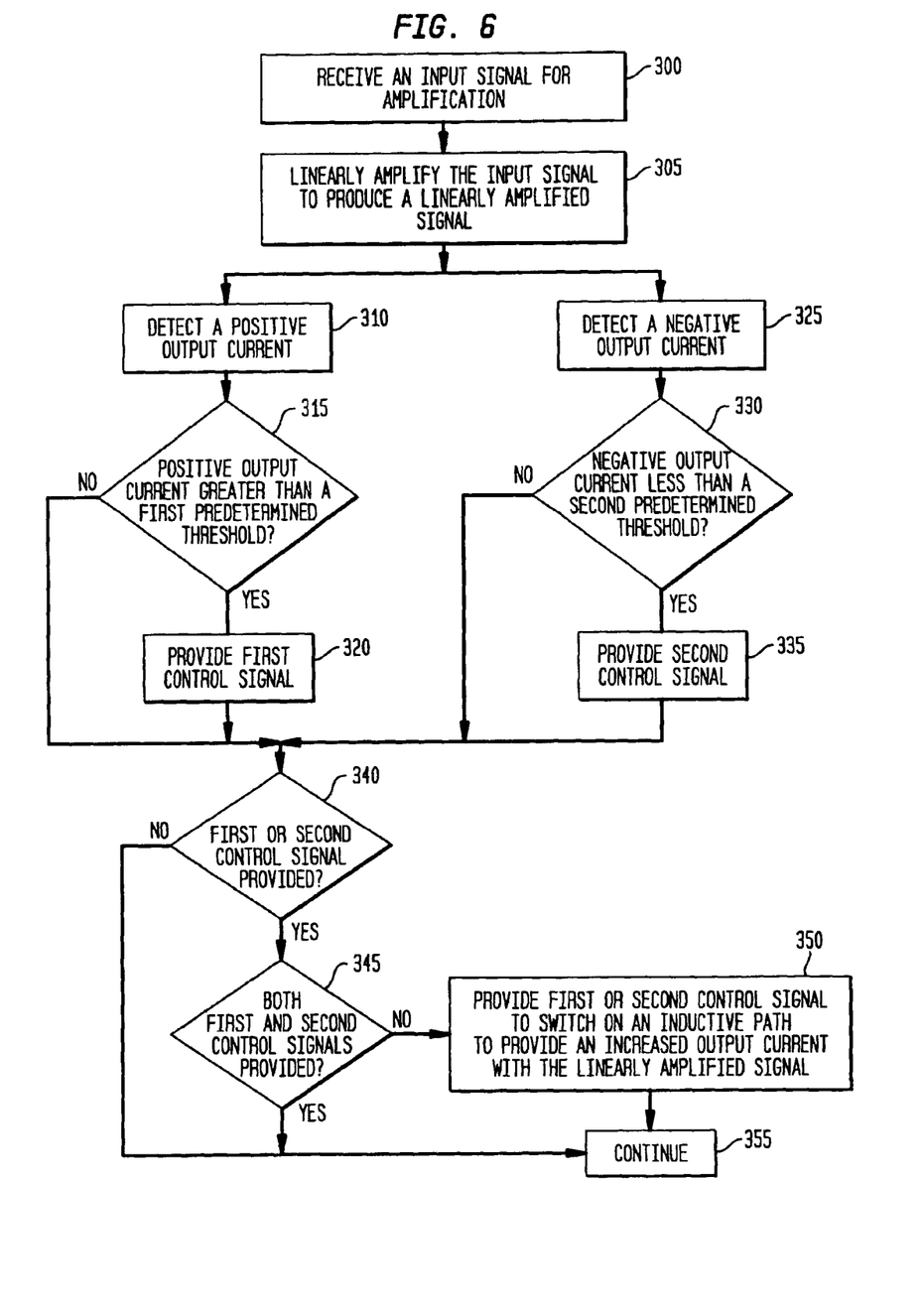
FIG. 6 is a flow diagram illustrating an exemplary method in accordance with the present invention.

More particularly, referring to the flow diagram of FIG. 6 illustrating a method in accordance with the present invention, the method begins with reception of an input signal for amplification, step 300. Next, the input signal is linearly amplified to produce a linearly amplified signal, step 305. The method then detects or senses the output current level in steps 310 and 325, sensing the positive output current level in step 310, and the negative output current level in step 325. Following step 310, the method then determines whether the sensed positive output current level is greater than a predetermined level or threshold, step 315, and if so, provides a first control signal, step 320. If the sensed positive output current level is not greater than the predetermined level or threshold in step 315, then this portion of the method proceeds to step 340.

Occurring during the same time interval as steps 310 through 320, the method also detects or senses the negative output current level in step 325. Following step 325, the method then determines whether the sensed negative output current level has a magnitude (or absolute value) which is greater than a predetermined level or threshold, step 330, and if so, provides a second control signal, step 335. If the magnitude of the sensed negative output current level is not greater than the predetermined level or threshold in step 330, then this portion of the method also proceeds to step 340. As an alternative in step 330, in lieu of determining a magnitude of the sensed negative output current level, the sensed negative output current level may be compared to a negative threshold level, with a determination made as to whether the sensed negative output current level is simply more negative than the threshold.

Following steps 320 and 335, the method determines whether either a first or second control signal has been generated in steps 320 or 335, step 340. If no control signal has been generated, the method continues, step 355. If a control signal has been generated, as determined in step 340, the method determines whether two control signals, both the first control signal and the second control signal, have been generated, step 345. If both first and second control signals have been generated, then the method also continues, step 355. When either a first control signal or a second control signal has been generated, but not both, the method proceeds to step 350, and provides the corresponding control signal to switch on an inductive path, to provide or generate increased output current, with the linearly amplified signal, to a load, such as a communication line or medium. Following steps 350, 345 or 340, the method continues for as long as an input signal is to be linearly amplified with potentially increased output current levels.

The advantages of the present invention are readily apparent. The present invention utilizes both linear amplification and switching amplification, providing both a high degree of linearity and accuracy while providing improved power efficiencies. The linear driver portion of the invention provides control over the linearity or accuracy of the output signal. The switching driver portion, with an inductive circuit, provides the bulk of the output current at a very high efficiency, as needed. The present invention is also readily implementable and backwards compatible for existing technologies, and capable of embodiment without undue expense.

From the foregoing, it will be observed that numerous variations and modifications may be effected without departing from the spirit and scope of the novel concept of the invention. It is to be understood that no limitation with respect to the specific methods and apparatus illustrated herein is intended or should be inferred. It is, of course, intended to cover by the appended claims all such modifications as fall within the scope of the claims.

What is claimed is:

1. A switched linear amplifier for amplifying an input signal for provision to a communication medium, the switched linear amplifier comprising:

a linear amplifier for amplifying the input signal to produce a linearly amplified signal;

an output current detector coupled to the linear amplifier, the output current detector capable of detecting an output current level and providing a control signal; and a switched inductive circuit coupled to the linear amplifier and to the output current detector, the switched inductive circuit capable of responding to the control signal to provide an inductive path for providing current with the linearly amplified signal.

2. The switched linear amplifier of claim 1, wherein the linear amplifier further comprises an operational amplifier.

3. The switched linear amplifier of claim 1, wherein the output current detector further comprises:

a positive output current detector coupled to the linear amplifier, the positive output current detector providing a first signal when a positive output current is greater than a first predetermined threshold;

a negative output current detector coupled to the linear amplifier, the negative output current detector providing a second signal when a negative output current is less than a second predetermined threshold; and an exclusion circuit coupled to the positive output current detector and the negative output current detector, the exclusion circuit operative to generate the control signal to the switched inductive circuit when only the first signal or only the second signal has been provided.

4. The switched linear amplifier of claim 3, wherein the positive output current detector and the negative output current detector each respectively comprise:
a voltage divider circuit coupled to the linear amplifier through a resistor;
a comparator coupled to the voltage divider circuit; and
a flip-flop coupled to the comparator.

5. The switched linear amplifier of claim 3, wherein the exclusion circuit further comprises:
a first NAND gate coupled to the positive current detector and to the negative current detector;
a second NAND gate coupled to the positive current detector and to the first NAND gate, the second NAND gate providing a first switch control signal;
a third NAND gate coupled to the negative current detector and to the first NAND gate; and
a fourth NAND gate coupled to the third NAND gate, the fourth NAND gate providing a second switch control signal.

6. The switched linear amplifier of claim 1, wherein the control signal further comprises a first switch control signal and a second switch control signal, and wherein the switched inductive circuit further comprises:
an inductor coupled to the linear amplifier;
a first transistor coupled to a first diode, the first transistor and the first diode farther coupled to the inductor, the first transistor responsive to the first switch control signal to provide a first conduction path for the inductor to form the inductive path; and
a second transistor coupled to a second diode, the second transistor and the second diode further coupled to the inductor, the second transistor responsive to the second switch control signal to provide a second conduction path for the inductor to form the inductive path.

7. A switched linear amplifier for amplifying an input signal for provision to a communication medium, the switched linear amplifier comprising:
a linear amplifier for amplifying the input signal to produce a linearly amplified signal;
an inductor coupled to an output of the linear amplifier;
a first current-controlled switch coupled to the linear amplifier and to the inductor, wherein the first current-controlled switch is capable of detecting a positive output current from the linear amplifier and providing a conductive path for the inductor; and
a second current-controlled switch coupled to the linear amplifier and to the inductor, wherein the second current-controlled switch is capable of detecting a negative output current from the linear amplifier and providing a conductive path for the inductor.

8. The amplifier of claim 7, wherein
the first current-controlled switch is configured to provide a conductive path for the inductor in response to a positive output current greater than a predetermined level.

9. The amplifier of claim 7, wherein
the second current-controlled switch is configured to provide a conductive path for the inductor in response to a negative output current having a magnitude greater than a predetermined level.

10. The amplifier of claim 7, further comprising first and second diodes respectively coupled to the first and second current-controlled switches.

11. A method for amplifying an input signal for provision to a communication medium, the method comprising:
(a) linearly amplifying the input signal to produce a linearly amplified signal;
(b) monitoring an output current level; and
(c) when the output Current level is greater than a predetermined threshold, providing an inductive path to provide current with the linearly amplified signal to the communication medium.

12. The method of claim 11, wherein step (b) further comprises:
detecting a positive output current and providing a first signal when the output current is greater than a first predetermined threshold; and
detecting a negative output current and providing a second signal when the negative output current is less than a second predetermined threshold.

13. The method of claim 12, wherein step (b) farther comprises:
generating a control signal when only the first signal or only the second signal has been provided.

14. The method of claim 13, wherein step (c) further comprise:
when the control signal is generated, switching on a conductive path through an inductive circuit.

15. A switched linear amplifier for amplifying an input signal, the switched linear amplifier comprising:
a linear amplifier for amplifying the input signal to produce a linearly amplified signal; and
a switchable current source coupled to the linear amplifier, the switchable current source capable of providing current with the linearly amplified signal when a magnitude of a current level of the linear amplifier is greater than a predetermined threshold.

16. A switched linear amplifier for amplifying an input signal, the switched linear amplifier comprising:
a linear amplifier for amplifying the input signal to produce a linearly amplified signal;
a current monitor coupled to the linear amplifier, the current monitor capable of detecting a current level of the linear amplifier and providing a control signal when a magnitude of the current level is greater than a predetermined threshold; and
a switchable current source coupled to the linear amplifier and to the current monitor, the switchable current source capable of responding to the control signal to provide current with the linearly amplified signal.

17. The switched linear amplifier of claim 16, wherein the linear amplifier is an operational amplifier.

18. The switched linear amplifier of claim 16, wherein the current monitor further comprises:
a positive current detector coupled to the linear amplifier, the positive current detector providing a first signal when a positive output current is greater than a first predetermined threshold;
a negative current detector coupled to the linear amplifier, the negative current detector providing a second signal when a negative output current is less than a second predetermined threshold; and
an exclusion circuit coupled to the positive current detector and the negative current detector, the exclusion circuit operative to generate the control signal to the switchable current source when only the first signal or only the second signal has been provided.

19. The switched linear amplifier of claim 16, wherein the switchable current source further comprises:
   an inductor; and
   a transistor coupled to the inductor, the transistor responsive to the control signal to provide a conductive path for the inductor for the provision of current with the linearly amplified signal.

20. The switched linear amplifier of claim 16, wherein the switchable current source further comprises:
   an inductor; and
   a current-controlled switch coupled to the linear amplifier and to the inductor.

* * * * *